(12) United States Patent
Fornasari et al.

(10) Patent No.: US 7,423,487 B2
(45) Date of Patent: Sep. 9, 2008

(54) VARIABLE GAIN FEEDBACK AMPLIFIER CIRCUIT APPARATUS AND METHOD THEREFOR

(75) Inventors: Marco Fornasari, Colchester (GB); Fesseha Tessera Seifu, London (GB); Samir Aboulhouda, Suffolk (GB)

(73) Assignee: Avago Technologies General IP Pte Ltd, Singapore (SG)

( * ) Notice: Subject to any disclaimer, the term of this patent is extended or adjusted under 35 U.S.C. 154(b) by 156 days.

(21) Appl. No.: 11/477,222

(22) Filed: Jun. 29, 2006

(65) Prior Publication Data

US 2007/0013445 A1 Jan. 18, 2007

(30) Foreign Application Priority Data

Jul. 7, 2005 (GB) ................................. 0513894.6

(51) Int. Cl.
*H03G 3/30* (2006.01)
(52) U.S. Cl. ......................... 330/282; 330/98; 330/283

(58) Field of Classification Search ................... 330/98, 330/100, 282, 283, 86
See application file for complete search history.

(56) References Cited

U.S. PATENT DOCUMENTS

| 4,608,542 A | 8/1986 | Siegel ......................... 330/279 |
| 4,849,712 A * | 7/1989 | Jarrett ......................... 330/283 |
| 6,014,061 A | 1/2000 | Tachigori ..................... 330/308 |

* cited by examiner

*Primary Examiner*—Steven J Mottola

(57) ABSTRACT

A variable gain feedback amplifier circuit comprising a degenerated common emitter circuit coupled to an emitter follower circuit, an output of the emitter follower circuit being coupled to an input of the degenerated common emitter circuit via a variable feedback impedance. An automatic gain controller is coupled to the variable feedback impedance in order to reduce a closed loop gain of the variable gain feedback amplifier circuit when required. The degenerated common emitter circuit also comprises a variable emitter impedance that is also controlled by the automatic gain controller so as to counteract a lowering effect of a reduction in the variable feedback impedance on the open-loop gain of the variable gain feedback amplifier circuit.

8 Claims, 1 Drawing Sheet

VARIABLE GAIN FEEDBACK AMPLIFIER CIRCUIT APPARATUS AND METHOD THEREFOR

Figure 1:
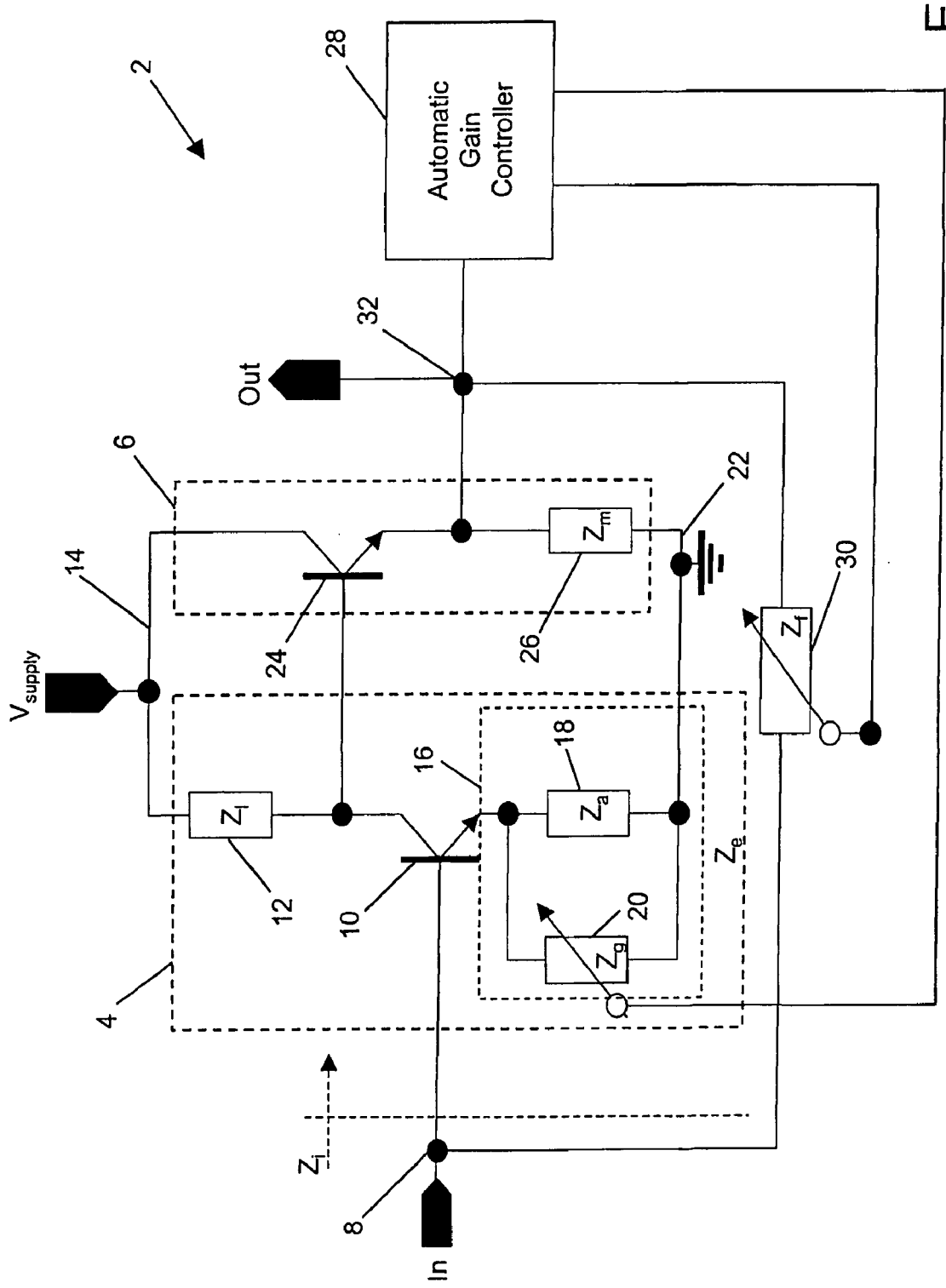

The present invention relates to a variable gain feedback amplifier circuit of the type, for example, that modified a closed loop gain associated therewith in order to reduce amplitude of a transient output signal so as to maintain the output transient amplitude within predetermined amplitude limits. The present invention also relates to a method of preventing an open-loop gain increase of the type, for example, that occurs as a result of a reduction in a closed loop gain caused by decreasing a feedback impedance of a variable gain feedback amplifier circuit.

In the field of optical equalisation, it is currently desirable to develop Integrated Circuits (ICs) to extend electrically the optical transmission distance achievable at 10 Gb/s over multi-mode fibre. A short-term goal is to achieve lossless data transmission at 10 Gb/s over 300 metres of multi-mode grade fibre. Currently, an equalizer architecture sufficiently robust to achieve the 300 metres of lossless transmission consistently is not available. Work is thus underway in a number of companies to improve the equalizer algorithms and their implementations in silicon and software to achieve this 300 metre goal.

In this respect, a Trans-impedance Amplifier (TIA), more precisely a TIA pre-amplifier, having Automatic Gain Control (AGC) is employed as part of an integrated circuit to perform the above-described optical equilisation, the TIA pre-amplifier being required to process high-speed data signals. Such amplifier circuits naturally have an input and an output, a portion of an output signal at the output typically being fed back to the input of the TIA by a feedback branch of the amplifier circuit. The size of the portion of the output signal fed back to the input is governed by a variable impedance, $Z_f$, placed in the feedback branch, the variable impedance being controlled by a so-called automatic gain controller. Consequently, a closed loop gain of the feedback amplifier circuit can be algebraically expressed as:

$$G_{closed\ loop} = \frac{Out}{In} = Z_f.$$

However, a decrease in the closed loop gain results in a consequential increase in open-loop gain. The increase in open-loop gain causes a so-called "phase margin" to decrease, resulting in an increase in susceptibility of the above-described amplifier to electrical frequency oscillation. Electrical frequency oscillation is particularly acute in feedback amplifiers having automatic variable gain, since the oscillation can manifest itself over a wide frequency band, characteristic of feedback amplifiers. Consequently, circuitry is often required in order to counteract the electrical frequency oscillation.

Known solutions to overcome the problem of electrical frequency oscillation limit bandwidth of the amplifiers to relatively low frequencies with respect to those mentioned above, thereby improving the degraded phase margin by moving secondary poles to higher frequencies so as to decrease closed loop gain of the amplifier circuits. In order to achieve this, impedance of nodes that constitute sources of higher frequency poles are typically decreased. However, such solutions are unfeasible at high frequencies due to the complexity of implementing such solutions and current requirements of such solutions.

In relation to the above solutions, the amplifier circuit operates at a frequency that is an order of magnitude lower than the cut-off frequency of the switching devices employed in the amplifier circuit. However, if the above amplifier were to be driven by higher frequency input signals, i.e. the amplifier circuit would need to operate at a frequency closer to the cut-off frequency, the low impedance of nodes mentioned above would no longer be achieved and the movement of the secondary poles mentioned above would not be sufficiently great, resulting in a reduction in the phase margin and a consequential susceptibility to oscillation. Further, the above known solutions also limit performance of some key parameters of the amplifier circuit, for example electronic noise. In this respect, it is highly desirable in high-speed applications for the feedback amplifier circuit to amplify linearly with a consequential linear increase to a Signal-to-Noise (S/N) ratio of the feedback amplifier circuit.

According to a first aspect of the present invention, there is provided a variable gain feedback amplifier circuit apparatus comprising: a first input coupled to a degenerated common emitter circuit arrangement, the degenerated common emitter circuit arrangement having a first output; an emitter follower circuit arrangement having a second output, and a second input coupled to the first output of the degenerated common emitter circuit arrangement; wherein the second output is coupled to the first input via a variable feedback impedance; the degenerated common emitter circuit arrangement comprises a variable emitter impedance; and the variable feedback impedance and the variable emitter impedance are respectively controllable by at least one gain controller.

The variable emitter impedance may comprise a first fixed-value impedance coupled in parallel to a controllable variable emitter impedance.

The at least one gain controller may be arranged to vary the variable emitter impedance in response to a change to the variable feedback impedance.

The variable emitter impedance may be varied in response to a change to the variable feedback impedance so as to reduce an open loop gain of the amplifier circuit apparatus to compensate for an increase in the open loop gain of the amplifier circuit apparatus that otherwise results from a reduction to a closed loop gain of the amplifier circuit apparatus.

The at least one gain controller may be at least one automatic gain controller.

According to a second aspect of the present invention, there is provided a pre-amplifier circuit apparatus comprising the variable gain amplifier circuit apparatus as set forth above in relation to the first aspect of the invention.

According to a third aspect of the present invention, there is provided a channel equaliser apparatus comprising the variable gain amplifier circuit as set forth above in relation to the first aspect of the invention.

According to a fourth aspect of the present invention, there is provided a method of preventing an open-loop gain increase for a variable gain feedback amplifier circuit apparatus, the method comprising the steps of: varying a variable feedback impedance for reducing a closed-loop gain of the variable gain feedback amplifier circuit; and varying an emitter impedance in response to the variation to the variable feedback impedance so as to have a reducing influence on the open-loop gain so as to prevent an increase in the open-loop gain as a result of the variation to the variable feedback impedance.

It is thus possible to provide a variable gain feedback amplifier circuit apparatus and a method of preventing an open-loop gain increase that does not result in electrical frequency oscillation and possesses improved noise performance for high-frequency signals, for example signals having a frequency of a same order of magnitude as a transition frequency of the transistors from which the amplifier circuit is formed, over known variable gain feedback amplifier circuits. Also, the amplifier circuit apparatus posses a simpler structure to the known variable gain feedback amplifier circuits, and the amplifier circuit apparatus also draws less current than the known variable gain feedback amplifier circuits at high frequencies, since the amplifier circuit apparatus does not need active components to maintain the open loop gain.

At least one embodiment of the invention will now be described, by way of example only, with reference to the accompanying FIG. 1, which is a schematic diagram of an integrated circuit constituting an embodiment of the invention.

Throughout the following description identical reference numerals will be used to identify like parts.

Referring to FIG. 1, a Trans-Impedance Amplifier (TIA) 2 for performance of pre-amplification in an equaliser circuit (not shown) comprises a degenerated common emitter circuit arrangement 4 and an emitter follower circuit arrangement 6.

An amplifier input terminal 8 is coupled to a base terminal of a first bipolar npn transistor 10 of the degenerated common emitter circuit arrangement 4, a collector terminal of the first bipolar transistor 10 being coupled to a first terminal of a collector impedance 12 ($Z_1$); a second terminal of the collector impedance 12 is coupled to a positive supply rail 14 maintained at $V_{supply}$ volts.

An emitter terminal of the first bipolar transistor 10 is coupled to an emitter impedance arrangement 16 having a resultant emitter impedance value ($Z_e$). In this example, the emitter impedance arrangement 16 comprises a first fixed-value ($Z_a$) emitter impedance 18 coupled in parallel with a variable emitter impedance 20, first terminals of the first emitter impedance 18 and the variable emitter impedance 20 being coupled to the emitter terminal of the first bipolar transistor 10. Second terminals of the first emitter impedance 18 and the variable emitter impedance 20 are coupled to an earth rail 22 maintained at ground potential.

In this example, the variable emitter impedance 20 is a pure capacitor network, such as a capacitor coupled in series with a Metal Oxide Semiconductor Field Effect Transistor (MOSFET). Use of the capacitor network, in this example, as the variable emitter impedance 20 results in the dc bias of the first bipolar transistor 10 not being perturbed when the closed loop gain decreases so that frequency stability can be achieved independently of the bias. The bias can then be selected in such a way that the best amplifier performance can be achieved.

The collector terminal of the first bipolar transistor 10 is also coupled to a base terminal of a second npn bipolar transistor 24 of the emitter follower circuit arrangement 6. A collector terminal of the second bipolar transistor 24 is coupled to the positive supply rail 14 and an emitter terminal of the second bipolar transistor 24 is coupled to a first terminal of a second fixed-value ($Z_m$) emitter impedance 26. A second terminal of the second fixed-value emitter impedance 26 is coupled to the earth rail 22. The emitter terminal of the second bipolar transistor 24 is also coupled to an input terminal of an automatic gain controller circuit unit 28. The structure of the automatic gain controller circuit unit 28 is in accordance with the structure of any suitable known gain controller circuit and so, for the sake of conciseness and clarity of description, the internal structure of this unit will not be described further herein.

The emitter terminal of the second bipolar transistor 24 is further coupled to a first terminal of a variable feedback impedance 30, a second terminal of the variable feedback impedance 30 being coupled to the amplifier input terminal 8. The emitter terminal of the second bipolar transistor 24 also therefore serves as an amplifier output terminal 32.

A control terminal of the variable feedback impedance 30 is coupled to a first output terminal of the automatic gain controller circuit unit 28, a second output terminal of the automatic gain controller circuit unit 28 being coupled to a control terminal of the variable emitter impedance 20.

In operation, a transient input current signal is provided at the amplifier input terminal 8, the TIA 2 amplifying the transient input signal to provide a transient voltage output signal at the amplifier output terminal 32. Since the mechanism for amplifying the transient input signal is well known in the art, the mechanism will not, for the sake of conciseness, be described further herein.

When a parameter of the transient output signal, for example a peak value or a root mean square value of the transient output signal, is equal to or exceeds a predetermined threshold value known to the automatic gain controller circuit unit 28, the automatic gain controller circuit unit 28, in accordance with normal operation thereof, adapts a first variable impedance value ($Z_f$) of the variable feedback impedance 30 via the control terminal of the variable feedback impedance 30.

The effect of reducing the first variable impedance value ($Z_f$) results in a closed loop gain of the TIA 2 decreasing in accordance with the algebraic expression mentioned above, whilst the open-loop gain of the TIA 2 rises in accordance with the following derivable algebraic expression:

$$G_{loop} = \frac{(Z_i \cdot Z_l)}{\left[(Z_i + Z_f) \cdot \left(Z_e + \frac{1}{g_m}\right) + (Z_i \cdot Z_f)\right]}$$

where $Z_i$ is an input impedance of the TIA 2, and $g_m$ is a transconductance of the TIA 2.

However, as mentioned above, when the open-loop gain is increased, the phase margin of the open loop of the TIA 2 is then decreased, which, in turn, causes the TIA 2 to be more susceptible to unwanted electrical frequency oscillations.

As can be seen from the above equation, an increase in the resultant emitter impedance value ($Z_e$) of the emitter impedance arrangement 16 can result in a decrease in the open-loop gain of the TIA 2. Therefore, in order to counteract the rise in the open-loop gain caused by decreasing the first variable (feedback) impedance value ($Z_f$), the automatic gain controller circuit unit 28 makes a consequential, and sufficient, change to a second variable impedance value ($Z_g$) of the variable emitter impedance 20, so as to cause the second variable impedance value ($Z_g$) to rise and hence the resultant emitter impedance value ($Z_e$) of the emitter impedance arrangement 16, thereby introducing a lowering influence to the open-loop gain of the TIA 2. The automatic gain controller circuit unit 28 adapts the second variable impedance value ($Z_g$) of the variable emitter impedance 20 via the control terminal of the variable emitter impedance 20 until the open-loop gain of the TIA 2 remains unchanged in spite of the influence of the decrease to the first variable impedance value ($Z_f$).

Whilst in the above example, the automatic gain controller circuit unit 28 modifies both the first and second impedance values, it should be appreciated that one or more control units can be employed to control the first and second variable impedances.

Although the above example employs bipolar transistors, the skilled person should appreciate that the amplifier circuit of the above example can be implemented using Field Effect Transistors (FETs).

The invention claimed is:

1. A variable gain feedback amplifier circuit apparatus comprising:
   a first input coupled to a degenerated common emitter circuit arrangement, the degenerated common emitter circuit arrangement having a first output;
   an emitter follower circuit arrangement having a second output, and a second input coupled to the first output of the degenerated common emitter circuit arrangement; wherein
   the second output is coupled to the first input via a variable feedback impedance;
   the degenerated common emitter circuit arrangement comprises a variable emitter impedance; and
   the variable feedback impedance and the variable emitter impedance are respectively controllable by at least one gain controller.

2. An apparatus as claimed in claim 1, wherein the variable emitter impedance comprises a first fixed-value impedance coupled in parallel to a controllable variable emitter impedance.

3. An apparatus as claimed in claim 1, wherein the at least one gain controller is arranged to vary the variable emitter impedance in response to a change to the variable feedback impedance.

4. An apparatus as claimed in claim 3, wherein the variable emitter impedance is varied in response to a change to the variable feedback impedance so as to reduce an open loop gain of the amplifier circuit apparatus to compensate for an increase in the open loop gain of the amplifier circuit apparatus that otherwise results from a reduction to a closed loop gain of the amplifier circuit apparatus.

5. An apparatus as claimed in claim 1, wherein the at least one gain controller is at least one automatic gain controller.

6. A pre-amplifier circuit apparatus comprising a variable gain amplifier circuit apparatus comprising:
   a first input coupled to a degenerated common emitter circuit arrangement, the degenerated common emitter circuit arrangement having a first output;
   an emitter follower circuit arrangement having a second output, and a second input coupled to the first output of the degenerated common emitter circuit arrangement; wherein
   the second output Is coupled to the first input via a variable feedback impedance;
   the degenerated common emitter circuit arrangement comprises a variable emitter impedance; and
   the variable feedback impedance and the variable emitter impedance are respectively controllable by at least one gain controller.

7. A channel equaliser apparatus comprising a variable gain amplifier circuit apparatus comprising:
   a first input coupled to a degenerated common emitter circuit arrangement, the degenerated common emitter circuit arrangement having a first output;
   an emitter follower circuit arrangement having a second output, and a second input coupled to the first output of the degenerated common emitter circuit arrangement; wherein
   the second output is coupled to the first input via a variable feedback impedance;
   the degenerated common emitter circuit arrangement comprises a variable emitter impedance; and
   the variable feedback impedance and the variable emitter impedance are respectively controllable by at least one gain controller.

8. A method of preventing an open-loop gain increase for a variable gain feedback amplifier circuit apparatus, the method comprising the steps of:
   varying a variable feedback impedance for reducing a closed-loop gain of the variable gain feedback amplifier circuit; and
   varying an emitter impedance in response to the variation to the variable feedback impedance so as to have a reducing influence on the open-loop gain so as to prevent an increase in the open-loop gain as a result of the variation to the variable feedback impedance.

* * * * *